United States Patent
Kim

(10) Patent No.: US 8,496,770 B2
(45) Date of Patent: Jul. 30, 2013

(54) METHOD OF MANUFACTURING MULTILAYER CERAMIC SUBSTRATES

(75) Inventor: Won-Mook Kim, Gyeonggi-do (KR)

(73) Assignee: KoMiCo Co. Ltd., Gyeonggi-Do (KR)

( * ) Notice: Subject to any disclaimer, the term of this patent is extended or adjusted under 35 U.S.C. 154(b) by 0 days.

(21) Appl. No.: 13/321,939

(22) PCT Filed: May 26, 2010

(86) PCT No.: PCT/KR2010/003314
§ 371 (c)(1),
(2), (4) Date: Nov. 22, 2011

(87) PCT Pub. No.: WO2010/147313
PCT Pub. Date: Dec. 23, 2010

(65) Prior Publication Data
US 2012/0061002 A1    Mar. 15, 2012

(30) Foreign Application Priority Data
Jun. 19, 2009  (KR) .................. 10-2009-0054726

(51) Int. Cl.
| | |
|---|---|
| *C03B 29/00* | (2006.01) |
| *B29C 65/00* | (2006.01) |
| *B65C 9/25* | (2006.01) |
| *B32B 37/00* | (2006.01) |

(52) U.S. Cl.
USPC ............... 156/89.12; 156/89.11; 156/268; 156/323; 156/289

(58) Field of Classification Search
USPC ............ 156/89.11, 89.12, 89.16, 182, 252, 156/253, 278, 280, 268, 272.8, 247, 323, 156/285, 289
See application file for complete search history.

(56) References Cited

U.S. PATENT DOCUMENTS 5,788,808 A * 8/1998 Natarajan et al. ............. 156/580
5,858,145 A * 1/1999 Sreeram et al. ............. 156/89.16

(Continued)

FOREIGN PATENT DOCUMENTS

| JP | 2001-230548 | 8/2001 |
| JP | 2002-164654 | 6/2002 |

(Continued)

OTHER PUBLICATIONS

Harada et al., JP 2002-164655 a Machine translation, published Jun. 7, 2002.*

(Continued)

*Primary Examiner* — Philip Tucker
*Assistant Examiner* — Alex Efta
(74) *Attorney, Agent, or Firm* — Daly, Crowley, Mofford & Durkee, LLP

(57) ABSTRACT

In a method of manufacturing a multilayer ceramic substrate, first and second sheet stacks are formed by pressurizing a plurality of unsintered ceramic sheets, respectively. A hole is formed to penetrate through the second sheet stack. A third preliminary sheet stack is formed by positioning the second sheet stack on the first sheet stack. First and second thin films are formed at top and bottom of the third preliminary sheet stack, respectively. A third sheet stack is formed by pressurizing the first and the second thin films and the third preliminary sheet stack. The first and the second thin films are removed from the third sheet stack, thereby forming a preliminary multilayer ceramic substrate. The preliminary multilayer ceramic substrate is sintered. Accordingly, the reliability and stability of the manufacturing process for the multilayer ceramic substrate is sufficiently improved with reduced cost due to the flat molds and thin films.

10 Claims, 5 Drawing Sheets

U.S. PATENT DOCUMENTS

| | | | |
|---|---|---|---|
| 5,972,140 A * | 10/1999 | Hass et al. | 156/89.11 |
| 6,179,951 B1 * | 1/2001 | Natarajan et al. | 156/285 |
| 6,423,174 B1 * | 7/2002 | Casey et al. | 156/285 |
| 7,244,331 B1 * | 7/2007 | Berry et al. | 156/289 |
| 2001/0022416 A1 * | 9/2001 | Harada et al. | 264/643 |
| 2004/0099364 A1 * | 5/2004 | Suzuki et al. | 156/89.11 |
| 2005/0199331 A1 * | 9/2005 | Nakano et al. | 156/89.11 |
| 2006/0180269 A1 * | 8/2006 | Karatsu et al. | 156/230 |
| 2006/0234023 A1 * | 10/2006 | Endou et al. | 428/210 |

FOREIGN PATENT DOCUMENTS

| | | |
|---|---|---|
| JP | 2002-164655 | 6/2002 |
| JP | 2002164655 A * | 6/2002 |
| JP | 2003-158375 | 5/2003 |

OTHER PUBLICATIONS

Notification of Transmittal of the International Search Report dated Dec. 16, 2010, PCT/KR2010/003314.

* cited by examiner

METHOD OF MANUFACTURING MULTILAYER CERAMIC SUBSTRATES

TECHNICAL FIELD

Example embodiments relate to a method of manufacturing a multilayer ceramic substrate, and more particularly, to a method of manufacturing a multilayer ceramic substrate having a cavity for a ceramic electrostatic chuck or a ceramic heater.

BACKGROUND ART

In general, it is well known that multilayer ceramic substrates have good plasma resistance, oxide-resistance and chemical resistance as well as good electrical insulation. Thus, the multilayer ceramic substrate has been widely used in place of metal in various fields of an electric industry so as to compensate for the physical and chemical drawbacks of the metal. Particularly, the multilayer ceramic substrate has been much more widely used in place of the meal for manufacturing semiconductor devices. For example, the multilayer ceramic substrate has been used for an electrostatic chuck for securing a wafer by an electrostatic force thereon and a ceramic heater for heating a wafer to a high temperature in various processes for manufacturing the semiconductor devices.

The conventional multilayer ceramic substrate is usually manufactured as follows. A plurality of unsintered ceramic sheets is stacked together with one another and is pressurized to be secured to each other. Then, the bundle of the secured ceramic sheets is sintered to a sintering temperature, to thereby manufacture the multilayer ceramic substrate. Particularly, when the multilayer ceramic substrate is used as the electrostatic chuck or the ceramic heater, an electrode layer (or an electrode pattern) may be interposed between the unsintered ceramic sheets and a wiring electrically connected to the electrode layer is exposed outwards through a cavity. An electric power is transferred to the electrode layer through the wiring and the electrode layer generates the electrostatic force or the heat.

FIG. 1 is a cross-sectional view illustrating a processing step for a method of manufacturing a conventional multilayer ceramic substrate having the cavity.

Referring to FIG. 1, a plurality of unsintered ceramic sheets 1 is stacked on each other and an electrode layer 8 may be formed on the unsintered ceramic sheets 1. Then, a plurality of unsintered ceramic sheets having holes 2 for the cavity 3 is stacked on the electrode layer 8. The plurality of the unsintered ceramic sheets is pressurized to each other to thereby form a sheet stack 4 in which the neighboring ceramic sheets 1 are secured to each other. Finally, the sheet stack 4 is heated to a sintering temperature to thereby form the conventional multilayer ceramic substrate having the cavity 3.

Particularly, the pressurization to the unsintered ceramic sheets 1 is usually performed by using a pair of flat molds 5 and 6 that are positioned at a bottom and a top of the sheet stack 4 in parallel with each other. Therefore, there is a problem in that a bottom of the cavity 3 is difficult to be pressurized while pressurizing the sheet stack 4. That is, the electrode layer 8 exposed through the cavity 3 does not make direct contact with the flat molds and thus is difficult to be pressurized in the pressurization process. Therefore, the ceramic sheets 1 tends to be separated from each other and the electrode layer 8 and the ceramic sheets 1 are likely to be deformed.

For those reasons, there has been suggested that a protrusion protruded into the cavity 3 be installed to the flat mold. However, the correct insertion of the protrusion to the cavity 3 generally requires respective flat mold corresponding to the individual cavity in accordance with the shapes and structures thereof and thus necessarily requires an additional alignment process for aligning the protrusion with the cavity 3, which causes operational inconveniences of the flat mold and hardship to a quick treatment of a manufacturing apparatus. In addition, when the protrusion is not accurately matched with the cavity 3, the external pressure applied to the flat mold is likely to be difficult to be exactly transferred to a bottom of the cavity 3. Thus, the pressure to the bottom of the cavity 3 is so weak that the ceramic sheets 1 are not sufficiently pressurized to each other or the pressure to the bottom of the cavity 3 is so strong that the electrode layer 8 is likely to be deformed.

Further, there has been suggested that a plurality of the ceramic sheets 1 be pressurized into the sheet stack 4 and a recess be formed on the sheet stack 4 by cutting off a portion the sheet stack 4 as the cavity 3. However, the partial cut-off of the sheet stack 4 tends to cause damage to the electrode layer 8 and the ceramic sheets 1 around the cavity 3.

Accordingly, there is still a need for an improved method of manufacturing the multilayer ceramic substrate in which the cavity can be easily and effectively formed in the sheet stack.

DISCLOSURE OF THE INVENTION

Technical Problem

Example embodiments provide a method of easily and stably manufacturing a multilayer ceramic substrate having a cavity by using a pair of flat molds regardless of the shapes of the cavity.

Technical Solution

According to some example embodiments, there is provided a method of manufacturing a multilayer ceramic substrate. First and second sheet stacks may be formed by pressurizing a plurality of unsintered ceramic sheets, respectively, through a first pressurization process. A hole may be formed to penetrate through the second sheet stack. A third preliminary sheet stack may be foil led by positioning the second sheet stack having the hole on the first sheet stack. First and second thin films may be formed at top and bottom of the third preliminary sheet stack, respectively. A third sheet stack may be formed by pressurizing the first and the second thin films and the third preliminary sheet stack through a second pressurization process. The first and the second thin films may be removed from the third sheet stack, and then the third sheet stack is sintered.

In an example embodiment, the third preliminary sheet stack includes a cavity that is defined by inner walls of the hole of the second sheet stack and the first sheet stack under the second sheet stack and such that the cavity is covered with the first thin film and the first and the second thin films includes resin such that air in the cavity is prevented from being leaked through the first and the second sheet stacks.

In an example embodiment, at least a silicon (Si) layer may be further formed between an upper surface of the second sheet stack and the first thin film and between a lower surface of the first sheet stack and the second thin film. In such a case, the resin comprises polyethylene terephthalate (PET).

In an example embodiment, the first pressurization process may be performed at a pressure lower than that of the second pressurization process.

In an example embodiment, the first pressurization process may be performed at a pressure of 1 MPa to 2 MPa and the second pressurization process is performed at a pressure of 3 MPa to 3.5 MPa.

In an example embodiment, the first pressurization process may be performed for a shorter time than the second pressurization process.

In an example embodiment, the first pressurization process may be performed for a time of 85 seconds to 95 seconds and the second pressurization process is performed for a time of 595 seconds to 605 seconds.

In an example embodiment, the first and the second pressurization processes may be performed by using a pair of flat molds arranged in parallel with each other.

In an example embodiment, the first and the second pressurization processes may be performed at temperature of 65° C. to 100° C.

In an example embodiment, before forming a third preliminary sheet stack, an electrode layer may be further formed on the first sheet stack.

Advantageous Effects

According to some example embodiments of the present inventive concept, the hole of the third preliminary sheet stack may be covered with the thin films at the upper and bottom portions to thereby form the cavity in such a way that the air in the cavity may be sufficiently sealed from surroundings in the second pressurization process for forming the third sheet stack using a pair of the flat molds. Accordingly, a sufficient air pressure may be applied to the bottom of the cavity proportional to the external pressure that may be applied to the flat molds by the second pressurization process and thus the bottom of the cavity may be sufficiently adhered to an individual ceramic layer of the sheet stack although the bottom of the cavity may not make direct contact with the flat mold. Therefore, the multilayer ceramic substrate having the cavity may be easily manufactured by using the flat molds irrespective of the shape of the cavity.

Particularly, the third sheet stack may be formed by the second pressurization process using the flat molds regardless of the shape of the cavity, and thus no individual molds just only for a particular shape of the cavity may be needed to and the molds may be standardized, to thereby reduce the align time of the individual molds with the sheet stacks. In addition, the standardization of the molds may improve the compatibility of a manufacturing apparatus and simplicity of the manufacturing process. Further, the electrode layer may not make direct contact with the mold in the second pressurization process and thus the cavity may be designed regardless of the flat mold, to thereby prevent the damage and contamination of the electrode layer and design facility.

In addition, the multilayer ceramic substrate of the present inventive concept may be formed by separated two steps of pressurization processes through first and second pressurization processes. Particularly, the first pressurization process may be performed at a pressure lower than that of the second pressurization process for a shorter time than that of the second pressurization process, thereby improving efficiency and stability of the process for manufacturing the ceramic substrate.

BRIEF DESCRIPTION OF THE DRAWINGS

Example embodiments will be more clearly understood from the following detailed description taken in conjunction with the accompanying drawings.

BEST MODE FOR CARRYING OUT THE INVENTION

Figure 1:
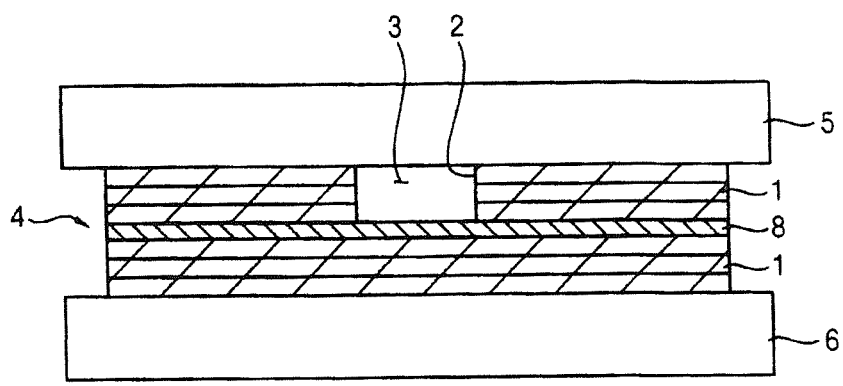
FIG. 1 is a cross-sectional view illustrating a processing step for a method of manufacturing a conventional multilayer ceramic substrate having the cavity.

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings. A deposition apparatus for forming a thin layer on a semiconductor substrate such as a wafer may be provided as an example of an apparatus for processing a substrate hereinafter. However, the deposition apparatus is merely illustrative example embodiment and is not to be construed as limiting thereof. Thus, the lift pin of the present example embodiment of the present inventive concept may also be applied to various apparatus for processing the substrate such as a dry etching apparatus, a planarization apparatus and an ion implantation process just under condition that the process is performed onto the substrate positioned on a susceptor in the apparatus.

Figure 2:
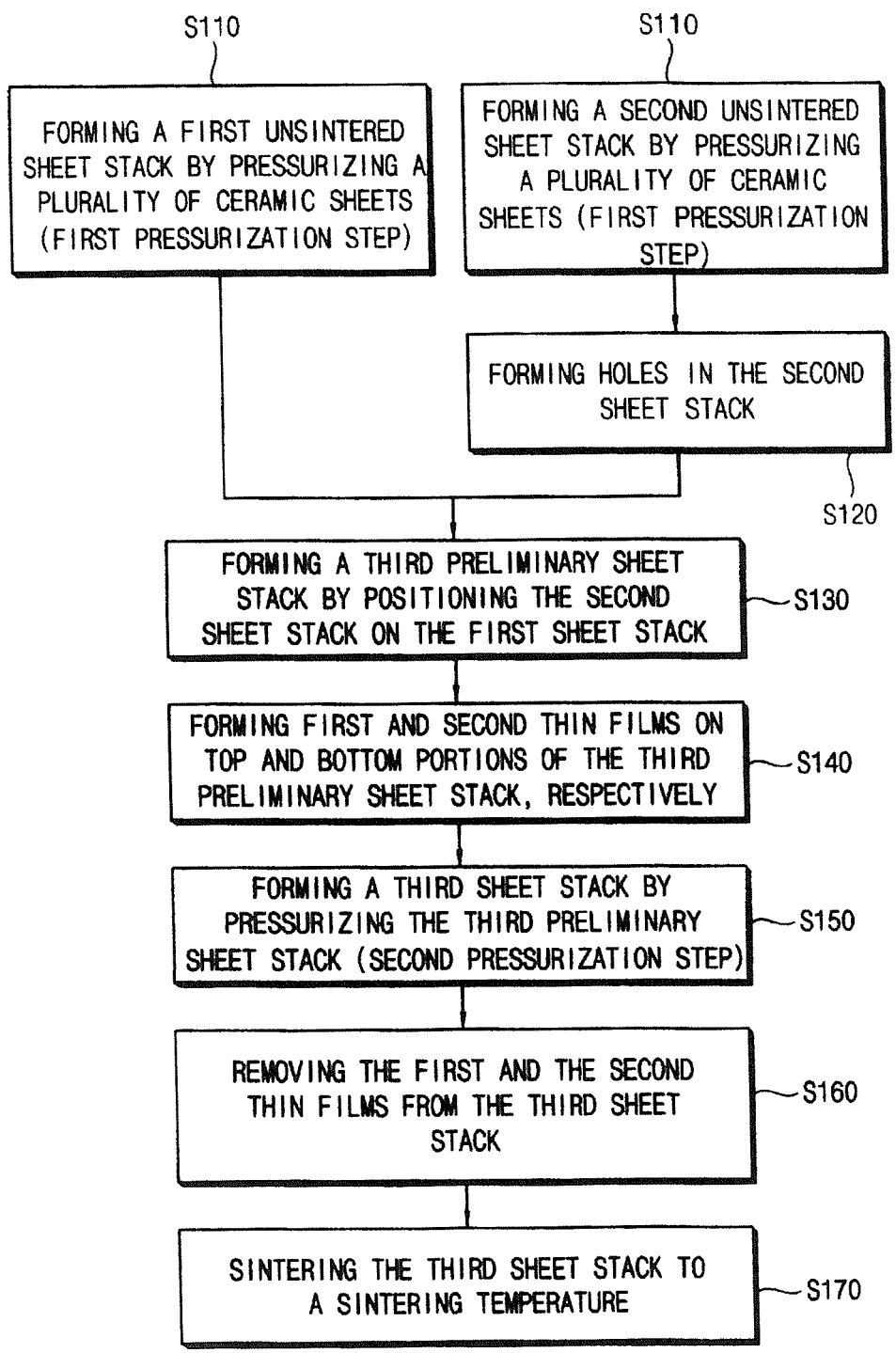
FIG. 2 is a flow-chart showing a method of manufacturing a multilayer ceramic substrate having a cavity in accordance with an example embodiment of the present inventive concept.

FIG. 2 is a flow-chart showing a method of manufacturing a multilayer ceramic substrate having a cavity in accordance with an example embodiment of the present inventive concept. FIGS. 3 to 9 are cross-sectional views illustrating processing steps for the method of manufacturing a multilayer ceramic substrate shown in FIG. 2.

Figure 3:
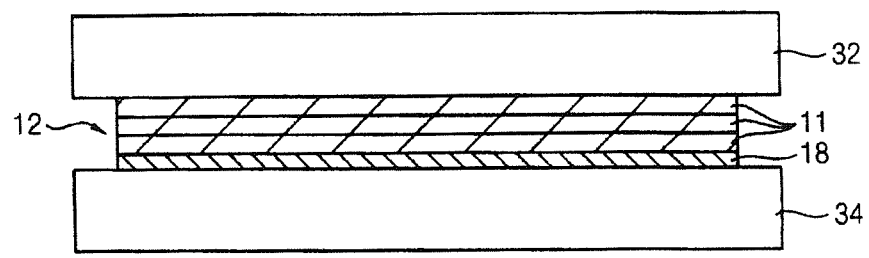
FIGS. 3 to 9 are cross-sectional views illustrating processing steps for the method of manufacturing a multilayer ceramic substrate shown in FIG. 2.
Figure 4:
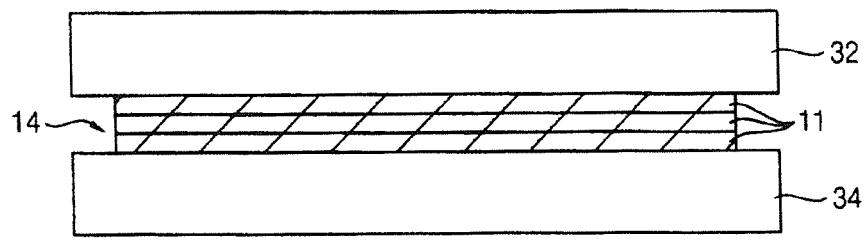

Referring to FIGS. 2 to 4, a first unsintered sheet stack 12 and a second unsintered sheet stack 14 may be formed by a first pressurization process, respectively (step S110). For example, a plurality of unsintered ceramic green sheets 11 may be pressurized by the first pressurization process, to thereby form the first unsintered sheet stack 12 and a plurality of other unsintered ceramic green sheets may be pressurized by the first pressurization independently from the first unsintered sheet stack 12, to thereby form the second unsintered sheet stack 14.

Particularly, a ceramic powder and a dispersant for uniformly dispersing the ceramic powder may be dissolved into a solvent, to thereby form a first ceramic mixture. Then, an adhesive binder and a plasticizer may be mixed with the first ceramic mixture, to thereby form a second ceramic mixture. Air may be supplied into the second ceramic mixture and thus a plurality of air voids due to the air bubble may be distributed in the second ceramic mixture. When the second ceramic mixture including the air voids may be formed into the ceramic sheet 11, a plurality of recesses may be distributed on a surface of the ceramic sheet 11 due to the air voids while the air voids may still remain in the ceramic sheet 11. For those reasons, the air voids needs removing from the second ceramic mixture by an additional process. Thereafter, the second ceramic mixture having no air voids may be processed into a thin plate or thin structure by various processes, to thereby form the unsintered ceramic sheet 11 having no recesses and the air voids. For example, the second ceramic mixture may be formed into a number of sheets by a doctor blade process and the each of the processed sheets may be dried by a drying process, to thereby form the unsintered ceramic sheet 11.

Then, a plurality of the unsintered ceramic sheets 11 may be interposed between a pair of first and second flat molds 32 and 34, and then the first pressurization process may be performed to the ceramic green sheets 11 between the first and the second flat molds 32 and 34. An external pressure may be applied to the first and the second flat molds 32 and 34 and thus the unsintered ceramic sheets 11 may be pressurized in the medium of the flat molds 32 and 34. Accordingly, neighboring ceramic green sheets 11 may be adhered or secured to each other by the external pressure, to thereby form the first unsintered sheet stack 12. In the same way, a plurality of other unsintered ceramic green sheets may be interposed between the first and the second flat molds 32 and 34 and the first pressurization process may be performed to the ceramic green sheets between the first and the second flat molds 32 and 34, to thereby form the second unsintered sheet stack 14. That is, the ceramic sheets 11 may be adhered or secured to each other in the first and the second sheet stacks 12 and 14. Sometimes, the state of the ceramic green sheets 11 adhered to or secured to each other by the external pressure will be referred to as stacked state of the ceramic green states 11. In the present example embodiment, the first sheet stack 12 and the second sheet stack 14 may be formed by substantially the same first pressurization process.

Since the cavity 24 may be formed just merely in the second sheet stack 14, the first and the second sheet stacks 12 and 14 needs to be differentiated from each other in spite of the same formation process by the first pressurization process. Therefore, the first and the second sheet stacks 12 and 14 may not be necessarily formed at the same time as long as the first and the second sheet stacks 12 and 14 may be individually or respectively formed. For example, the first sheet stack 12 may be formed prior to or posterior to the second sheet stack 14. For those reasons, the processing steps for forming the first and the second sheet stacks 12 and 14 are denoted as the same reference numeral S110 in FIG. 2.

An electrode layer 18 may be provided for an electrostatic chuck or a ceramic heater. The electrode layer 18 may be built in the multilayer ceramic substrate and may cause an electrostatic force in the electrostatic chuck or may generate heat in the ceramic heater. In the present example embodiment, the electrode layer 18 may be formed to position between the first and the second sheet stacks 12 and 14. Particularly, the electrode layer 18 may be formed simultaneously with the first sheet stack 12 in the first pressurization process. The electrode layer 18 may be positioned at a top or a bottom of the plurality of the ceramic green sheets 11 and may be pressurized to the plurality of the ceramic green sheets 11 in the first pressurization process. In such a case, the electrode layer 18 may make direct contact with one of the first and the second flat molds 32 and 34 and may be damaged or contaminated by the flat molds 32 and 34. Accordingly, a protection film (not shown) may be provided between the electrode layer 18 and one of the flat molds 32 and 34. Any kind of the protection film may be allowable as long as the electrode layer 18 may be sufficiently protected in the first pressurization process. For example, the protection film 18 may comprise a resin or the same material as first and second thin films 42 and 44 that will be described in detail hereinafter. The electrode layer 18 may be formed on a surface of the second sheet stack 14 by the first pressurization process and then the first sheet stack 12 may be positioned on the electrode layer 18. Otherwise, an individual sheet for an electrode may be positioned between the first and the second sheet stacks 12 and 14 and may be formed into the electrode layer 18 when the first and the second sheet stacks 12 and 14 may be formed into a sheet stack 10 (described in detail hereinafter) by a second pressurization process.

Figure 5:
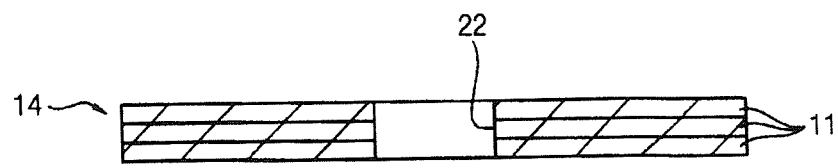

Referring to FIGS. 2 and 5, a hole 22 for the cavity 24 may be formed in one of the first and the second sheet stacks 12 and 14 (S120). In the present example embodiment, the hole 22 is formed through the second sheet stack 14.

Various processes may be used for forming the hole 22 through the second sheet stack 14. For example, a punching process and a drilling process may be used for forming the hole 22. Otherwise, a laser beam may also be used for forming the hole 22. Any other processes may also be used for forming the hole 22 as long as the hole 22 is formed into an expected shape. Thus, the first sheet stack 12 is formed to have the electrode layer 18 and the second sheet stack 14 may be formed to have the hole 22.

Figure 6:
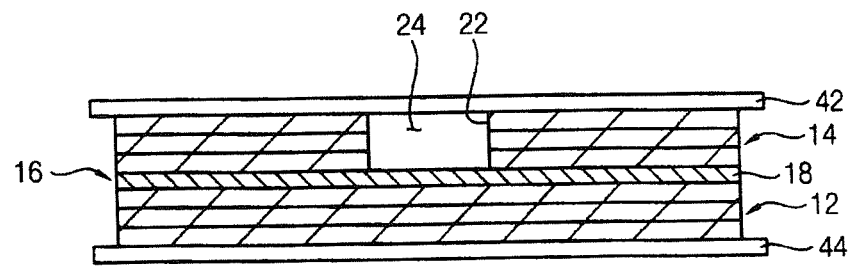

Referring to FIGS. 2 and 6, the second sheet stack 14 through which the hole 22 is formed may be positioned on the first sheet stack 12 with which the electrode layer 18 may be provided, to thereby form a third preliminary unsintered sheet stack 16 (step S130). Then, a first thin film 42 may be formed on a top portion of the third preliminary sheet stack 16 to thereby cover the hole 22 and a second thin film 44 may be formed on a bottom portion of the third preliminary sheet stack 16 (step S140).

Particularly, the first and the second sheet stacks 12 and 14 may be arranged in such a way that the electrode layer 19 may be interposed between the first and the second sheet stacks 12 and 14. That is, the second sheet stack 14 having the hole 22 may be positioned on the first sheet stack 12 on which the electrode layer 18 may be formed. Therefore, a cavity 24, which may be defined by inner walls of the hole 22 and the first sheet stack 12, may be formed on the third preliminary sheet stack 16 in such manner that the electrode layer 18 may be exposed through the cavity 24. That is, the bottom of the cavity 24 may correspond to the electrode layer 18.

After formation of the third preliminary sheet stack 16, the first thin film 42 and the second thin film 44 may be formed at the top and the bottom portions of the third preliminary sheet stack 16, respectively, for preventing the third preliminary sheet stack 16 from communicating with surroundings through the top and the bottom thereof. That is, the first thin film 42 may be formed at a top portion of the second sheet stack 14 and the second thin film 44 may be formed at a bottom portion of the first sheet stack 12. When a second pressurization process may be performed to the third preliminary sheet stack 16 covered with the thin films 42 and 44, an air pressure may be generated in the cavity 24 due to the first and the second thin films 42 and 44.

Particularly, the cavity 24 may be covered with the first thin film 42 and thus the cavity 24 may be sealed from surroundings. In the present example embodiment, the first thin film 42 may include a sealing member for preventing an air in the cavity 24 from communicating with surroundings and thus the air pressure in the cavity 24 may be maintained to be constant in the second pressurization process. For example, the first and the second thin films 42 and 44 may comprise a resin-based material for sealing air such as polyethylene terephthalate (PET) resin. Further, the first and the second thin films 42 and 44 may be coated with silicon (Si) to thereby facilitate separation of the first and the second thin films from the preliminary third sheet stack 16*a*. The silicon (Si) layer may be formed on a portion of first and second sheet stacks 12 and 14 with which the thin films 42 and 44 may make contact. Otherwise, the silicon (Si) layer may be formed on a whole surface of the first and the second thin films 42 and 44. That is, the silicon (Si) layer may be formed between an upper surface of the second sheet stack 14 and the first thin film 42 and may be formed between a lower surface of the first sheet stack 12 and the second thin film 44. While the present example embodiment discloses the PET resin as the first and the second thin films 42 and 44, any other materials or members known to one of the ordinary skill in the art may also be used as the thin films 42 and 44 as long as the cavity 24 is sufficiently sealed from the surroundings for the air sealing and a sufficient pressure resistance is allowable in the following second pressurization process.

The first and the second thin films 42 and 44 may adhere to a surface of the preliminary third sheet stack 16, and thus the first and the second thin films 42 and 44 may constrain the third preliminary sheet stack 16. Accordingly, the first and the second sheet stacks 12 and 14 as well as the ceramic sheets 11 thereof may be sufficiently prevented from deformation in the second pressurization process.

Figure 7:
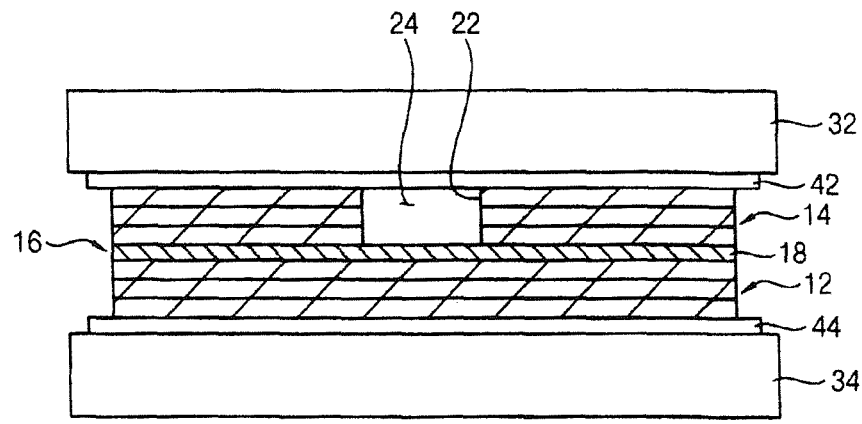

Referring to FIGS. 2 and 7, the first thin film 42, the second thin film 44 and the third preliminary sheet stack 16 may be pressurized into a third unsintered sheet stack 16 (step S150). Particularly, the third preliminary sheet stack 16 on which the first and the second thin films 42 and 44 may be formed may be interposed between a pair of the flat molds 32 and 34 and the second pressurization process may be performed to the flat molds 32 and 34. In the present example embodiment, the flat molds 32 and 34 for the second pressurization process may be substantially the same as those for the first pressurization process, and thus the same reference numerals 32 and 34 denote the flat molds in FIG. 7 as well as in FIGS. 3 and 4. According to the second pressurization process, the first and the second sheet stacks 12 and 14 may be adhered or secured to each other, to thereby form the third sheet stack 16.

The flat molds 32 and 34 may include a flat panel structure and thus the bottom of the cavity 24 may not make direct contact with the first mold 32 in the second pressurization process. However, since the first and the second thin films 42 and 44 may be arranged on top and bottom portions of the third preliminary sheet stack 16*a*, the cavity 24 may be sufficiently sealed from surroundings in the second pressurization process. The first thin film 42 may cover the cavity 24 at a top portion thereof and the air in the cavity 24 may be prevented from leaking upwards in the second pressurization process. The second thin film 44 may prevent the air in the cavity 24 from leaking through the ceramic sheets 11 downwards in the second pressurization process. Since the unsintered ceramic sheet 11 of the first and the second sheet stacks 12 and 14 may be relatively well communicated with surroundings and thus may be poor at air sealing, a large amount of the air in the cavity 24 may be leaked to the surroundings through the ceramic sheet 11 in the second pressurization process. Thus, the air pressure may not be generated in the cavity 24 after the second pressurization process. Accordingly, the air in the cavity 24 may be sufficiently sealed from surroundings by the first and the second thin films 42 and 44 in the second pressurization process, and the cavity 24 may be under a sufficient air pressure in the second pressurization process.

The air pressure in the cavity 24 may be proportional to an external pressure that may be applied to the first thin film 42 through the first flat mold 32 in the second pressurization process and thus the electrode layer 18 at the bottom of the cavity 24 may also be pressurized proportional to the external pressure. That is, although the bottom of the cavity 24 may not make direct contact with the first flat mold 32, the electrode layer 18 corresponding to the bottom of the cavity 24 may be sufficiently adhered to and stacked on the first sheet stack 12 by the air pressure in the cavity 24 that may be proportional to the external pressure of the upper flat mold 32. Accordingly, although not being directly pressurized in the second pressurization process, the electrode layer 18 may be stably arranged in the third sheet stack 16 due to an indirect pressurization caused by the air pressure in the cavity 24.

While the present example embodiment disclose that the step of forming the third preliminary sheet stack 16, the step of forming the first and the second thin films at the upper and bottom portions of the third preliminary sheet stack 16 and the step of pressurizing the third preliminary sheet stack 16 are sequentially performed step by step, any other modifications of the steps and the sequential orders may be allowable as long as the first and the second thin films 42 and 44 may have the same structure and function, as would be known to one of the ordinary skill in the art. For example, the second thin film 44 may be firstly formed on the second flat mold 34 and then the first sheet stack 12 including the electrode layer 18 may be formed on the second thin film 44. Thereafter, the second sheet stack 14 including the hole 22 may be formed on the first sheet stack 12 and the first thin film 42 may be formed on the second sheet stack 14. Finally, the first flat mold 32 may be formed on the first thin film 42 and the second pressurization process may be performed on the flat molds 32 and 34. Therefore, the step of forming the third preliminary sheet stack 16 (step S130), the step of forming the first and the second thin films (step S140) and the step of forming the third sheet stack (step S150) may be exemplarily disclosed on condition that the first and the second sheet stacks 12 and 14 may be firstly formed prior to the formation of the firs the second thin films 42 and 44, and thus the above sequential order is not construed as limiting thereof.

Figure 8:
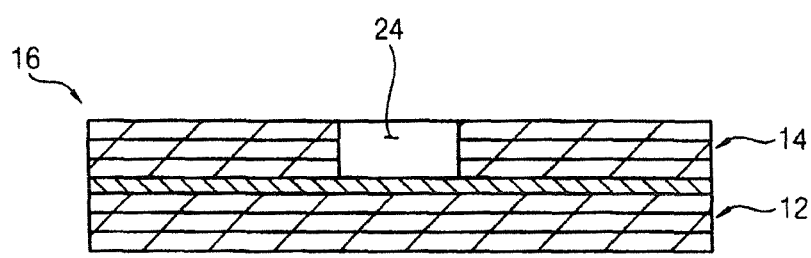

Referring to FIGS. 2 and 8, the first and the second thin films 42 and 44 may be removed from the third sheet stack 16 (step S160). Therefore, the third sheet stack 16 may be a preliminary multilayer ceramic substrate 10 including a plurality of the ceramic sheets 11 adhered or secured to each other, the electrode layer 18 between the ceramic sheets 11 and the cavity 24 penetrating some of the ceramic sheets 11 and exposing the electrode layer 18.

Figure 9:
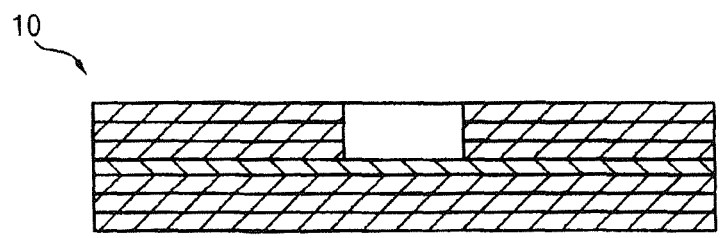

Referring to FIGS. 2 and 9, the third sheet stack 16 from which the first and the second thin films may be removed may be heated to a sintering temperature (step S170), to thereby form the multilayer ceramic substrate 10 having the cavity 24.

The sintering process to the preliminary multilayer ceramic substrate 10 may be varied according to the ceramics in the unsintered ceramic sheet 11. For example, when the unsintered ceramic sheet 11 may include alumina (Al2O3), the sintering process may be performed at a temperature of about 1,600° C. to about 1,650° C. in an atmosphere of wet hydrogen (H2) gases. In contrast, when the unsintered ceramic sheet 11 may include aluminum nitride (AlN), the sintering process may be performed at a temperature of about 1750° C. to about 1850° C. in an atmosphere of nitrogen (N2) gases.

Further, an anti-deformative ceramic sheet (not shown) may be further formed on upper and bottom portions of the preliminary multilayer ceramic substrate 10 and thus the ceramic sheets 11 of the preliminary multilayer ceramic substrate 10 may be sufficiently prevented from deformation in the sintering process. For example, the anti-deformative ceramic sheet may have a sintering temperature than that of the ceramic sheet 11.

As described above, a plurality of the ceramic sheets 11 may be formed into the first and the second sheet stacks 12 and 14, respectively, by the first pressurization process. Then, the electrode layer 18 may be formed on the first sheet stack 12 and the holes 22 for the cavity 24 may be formed in the second sheet stack 14. The first sheet stack including the electrode layer 18 and the second sheet stack 14 having the hole 22 may be formed into the third sheet stack 16, which may be covered with the first and the second thin films 42 and 44, by the second pressurization process. The thin films 42 and 44 may be removed from the third sheet stack 16, to thereby form the preliminary multilayer ceramic substrate 10. The preliminary multilayer ceramic substrate 10 may be sintered at the sintering temperature to thereby form the multilayer ceramic substrate of the present inventive concept.

In the present example embodiment, the first pressurization process may be performed at a pressure lower than that of the second pressurization process, and thus the ceramic sheet 11 may be prevented from sagging. The second pressurization process may be performed at conventional conditions.

For example, the first pressurization process may be performed under about 2 MPa and the second pressurization process may be performed under about 3.5 MPa. Preferably, the first pressurization process may be performed in a range of about 1 MPa to about 2 MPa and the second pressurization process may be performed in a range of about 3 MPa to about 3.5 MPa.

When the first pressurization process may be performed below about 1 MPa, the adherence of the ceramic sheets 11 and the electrode layer 18 to one another may be insufficient and thus the first sheet stack 12 may be deformed in the second pressurization process. For example, the first sheet stack 12 may be partially bulged toward the cavity 24 in the second pressurization process. In contrast, when the first pressurization process may be performed over about 2 MPa, there is a problem in that the first and the second sheet stacks 12 and 14 may not be sufficiently adhered to each other. When the second pressurization process may be performed over about 3.5 MPa, the first sheet stack 12 may also be deformed in the second pressurization process just like the partial bulge portion of the first sheet stack 12 toward the cavity 24.

The process time of the first and the second pressurization processes may also have effect on the quality of the adherence of the ceramic sheets 11 to each other. For example, the first pressurization process may be performed for about 85 seconds to about 95 seconds and the second pressurization process may be performed for about 595 seconds to about 606 seconds. Preferably, the first pressurization process may be performed for about 90 seconds and the second pressurization process may be performed for about 600 seconds. When the first and the pressurization processes may be performed out of the above proper process times, the same defects as described above when out of the proper pressure ranges may be found in the multilayer ceramic substrate.

Further, the first and the second pressurization processes may be performed at a temperature of about 65° C. to about 100° C. When the first and the second pressurization processes may be performed at a temperature below about 65° C., a binder for binding the ceramic sheets 11 may not be sufficiently active and thus it is difficult that the ceramic sheets 11 may be sufficiently adhered to each other. In contrast, when the first and the second pressurization processes may be performed at a temperature over about 100° C., most of organic materials in the ceramic sheet 11 (such as a binder and a plasticizer) may be oxidized, which may hinder the adherence of the ceramic sheets 11 to each other.

Particularly, the first and the second sheet stacks 12 and 14 may be respectively formed by the first pressurization process and the hole 22 for the cavity 24 may be easily formed just by penetrating a portion of the second sheet stack 14. Then, the third sheet stack 16 may be formed by combining the first and the second sheet stacks 12 and 14 by the second pressurization process. Thus, the separated first and the second pressurization processes may sufficiently facilitate the formation of the third sheet stack 16 having the cavity 24 as compared with the conventional formation of the sheet stack having the cavity in which the sheet stack is formed by a single pressurization process and a recess is formed in the sheet stack as the cavity. Further, the first pressurization process may be performed at a pressure than that of the second pressurization process for a shorter time than the second pressurization process, so that process defects of the ceramic sheets 11 such as the partial bulge to the cavity may be sufficiently minimized.

INDUSTRIAL APPLICABILITY

According to the example embodiments of the method of manufacturing the multilayer ceramic substrate, the third preliminary sheet stack including the cavity may be covered with the thin films at the upper and bottom portions thereof and thus the air in the cavity may be sufficiently sealed from surroundings in the second pressurization process for forming the third sheet stack using a pair of the flat molds. Accordingly, a sufficient air pressure may be applied to the bottom of the cavity proportional to the external pressure that may be applied to the flat molds by the second pressurization process and thus the bottom of the cavity may be sufficiently adhered to an individual ceramic layer of the sheet stack although the bottom of the cavity may not make direct contact with the flat mold. Therefore, the multilayer ceramic substrate having the cavity may be easily manufactured by using the flat molds irrespective of the shape of the cavity.

Further, the cavity of the third sheet stack may be easily formed just by combining the first and the second sheet stacks by the second pressurization process and may have various shapes according to the shape of the hole penetrating through the second sheet stack. The hole may be easily formed in the second sheet stack merely by penetrating some portion of the second sheet stack not by forming a recess thereon, and thus the hole may be formed into various shapes. As a result, the multilayer ceramic substrate of the present inventive concept may have a more stable adherence of the ceramic layers to each other and more various shapes through a more simplified and cost-reduced manufacturing process.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

The invention claimed is:

1. A method of manufacturing a multilayer ceramic substrate having a cavity, the method comprising:
    forming first and second sheet stacks by pressurizing a plurality of unsintered ceramic sheets, respectively, through a first pressurization process;
    forming a hole penetrating through the second sheet stack;
    forming a third preliminary sheet stack by positioning the second sheet stack having the hole on the first sheet stack such that a cavity is provided in the third preliminary sheet stack;
    adhering first and second thin films at top and bottom of the third preliminary sheet stack, respectively, such that the cavity is covered with the first thin film and the cavity is sealed from surroundings by the first thin film;
    forming a third sheet stack by pressurizing the first and the second thin films and the third preliminary sheet stack through a second pressurization process on condition that the cavity is under an air pressure in the second pressurization process; and
    sintering the third sheet stack after removing the first and the second thin films.

2. The method of claim 1, wherein the third preliminary sheet stack includes a cavity that is defined by inner walls of the hole of the second sheet stack and the first sheet stack under the second sheet stack and such that the cavity is covered with the first thin film and the first and the second thin films includes resin such that air in the cavity is prevented from being leaked through the first and the second sheet stacks.

3. The method of claim 2, further comprising forming at least a silicon (Si) layer between an upper surface of the second sheet stack and the first thin film and between a lower surface of the first sheet stack and the second thin film,
    wherein the resin comprises polyethylene terephthalate (PET).

4. The method of claim 1, wherein the first pressurization process is performed at a pressure lower than that of the second pressurization process.

5. The method of claim 4, wherein the first pressurization process is performed at a pressure of 1MPa to 2 MPa and the second pressurization process is performed at a pressure of 3 MPa to 3.5 MPa.

6. The method of claim 1, wherein the first pressurization process is performed for a shorter time than the second pressurization process.

7. The method of claim 6, wherein the first pressurization process is performed for a time of 85 seconds to 95 seconds and the second pressurization process is performed for a time of 595 seconds to 605 seconds.

8. The method of claim 1, wherein forming the first and the second pressurization processes are performed by using a pair of flat molds arranged in parallel with each other.

9. The method of claim 1, wherein the first and the second pressurization processes are performed at temperature of 65° C. to 100° C.

10. The method of claim 1, before forming a third preliminary sheet stack, further comprising forming an electrode layer on the first sheet stack.

\* \* \* \* \*